(12) United States Patent
O'Brien et al.

(10) Patent No.: US 7,461,367 B2
(45) Date of Patent: Dec. 2, 2008

(54) MODIFYING MERGED SUB-RESOLUTION ASSIST FEATURES OF A PHOTOLITHOGRAPHIC MASK

(75) Inventors: Sean C. O'Brien, Dallas, TX (US); Scott W. Jessen, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 746 days.

(21) Appl. No.: 11/114,582

(22) Filed: Apr. 26, 2005

(65) Prior Publication Data

US 2006/0240331 A1 Oct. 26, 2006

(51) Int. Cl.
*G06F 17/50* (2006.01)
(52) U.S. Cl. ............................. 716/19; 716/20; 716/21; 430/5; 430/30
(58) Field of Classification Search .............. 716/19–21; 430/5, 30
See application file for complete search history.

(56) References Cited

U.S. PATENT DOCUMENTS 7,001,693 B2* 2/2006 Liebmann et al. .............. 430/5

OTHER PUBLICATIONS

Heng et al., Application of Automated Design Migration to Alternating Phase shift Mask Design, Apr. 1-4, 2001, ACM, pp. 38-43.*
UMC and Synopsys Develop Reference Flow for UMC's Advanced Deep Submicron Processes, Collaboration Validates Synopsys' Galaxy Design Platform for UMC's 0.13 micron Process, Synopsys, Inc., Corporate, Copyright © 2005 Synopsys, Inc., http://www.synopsys.com, 2 pages, May 3, 2004.
Mentor Graphics Calibre Approved Verification Tool for IBM-Chartered 90nm Design Enablement Platform, www.mentor.com, Copyright © 2002, Mentor Graphics Corporation, 8 pages, May 24, 2004.
TSMC and Synopsys Address Design Challenges for 90 Nanometer and Below with TSMC Reference Flow 5.0, Synopsys, Inc., Corporate, Copyright © 2005 Synopsys, Inc., http://www.synopsys.com, 3 pages, Jun. 7, 2004.
MaskTools, Products/Profile, ASML MaskTools, Copyright © 2005 ASML, www. masktools.com, 13 pages, 2005.
Hercules Physical Verification Suite (PVS) The Industry's Fastest Physical Verification Solution, Synopsys, Inc., Products & Solutions, Copyright © 2005 Synopsys, Inc., http://www.synopsys.com, 4 pages, Jan. 6, 2005.
Product Overview, K2 Technologies, Copyright © 1995-2004, Cadence Design Systems, Inc. , 37 pages, Printed 2005.
Pending Patent Application filed Apr. 26, 2005, entitled "Merging Sub-Resolution Assist Features Of A Photolithographic Mask", 39 pages specification, claims and abstract, 3 pages of drawings, inventors Sean C. O'Brien et al.

* cited by examiner

*Primary Examiner*—Jack Chiang
*Assistant Examiner*—Nghia M Doan
(74) *Attorney, Agent, or Firm*—Jacqueline J. Garner; W. James Brady, III; Frederick J. Telecky, Jr.

(57) ABSTRACT

Modifying merged sub-resolution assist features includes receiving a mask pattern comprising the merged sub-resolution assist features, where a segmenting sub-resolution assist feature intersects a segmented sub-resolution assist feature at an intersection. Each sub-resolution assist feature is represented by an axis of the sub-resolution assist feature. The length of at least one axis is established, and an axis is modified in accordance with the length. Each axis is converted to a sub-resolution assist feature to yield the modified merged sub-resolution assist features.

13 Claims, 3 Drawing Sheets

FIG. 7

MODIFYING MERGED SUB-RESOLUTION ASSIST FEATURES OF A PHOTOLITHOGRAPHIC MASK

TECHNICAL FIELD

This invention relates generally to the field of photolithography and more specifically to modifying merged sub-resolution assist features of a photolithographic mask.

BACKGROUND

Masks are used to define patterns on objects. For example, photomasks are used in photolithographic systems to define patterns on semiconductor wafers to manufacture integrated circuits. Processing situations, however, may distort the resulting pattern defined on the object. For example, optical diffraction may cause the pattern defined on a wafer to differ from the pattern of the mask.

A mask may include features that compensate for distortions of a resulting pattern on a wafer. According to a known technique for compensating distortions, a mask may include sub-resolution assist features (SRAFs). An SRAF is designed to improve the process margin of a resulting wafer pattern, but not to be printed on the wafer. In certain situations, however, the SRAFs may be unsatisfactory. For example, the SRAFs may print on a wafer or may violate mask rules. It is generally desirable to have satisfactory SRAFs.

SUMMARY OF THE DISCLOSURE

In accordance with the present invention, disadvantages and problems associated with previous techniques for modifying merged SRAFs may be reduced or eliminated.

According to one embodiment of the present invention, modifying merged sub-resolution assist features includes receiving a mask pattern comprising the merged sub-resolution assist features, where a segmenting sub-resolution assist feature intersects a segmented sub-resolution assist feature at an intersection. Each sub-resolution assist feature is represented by an axis of the sub-resolution assist feature. The length of at least one axis is established, and an axis is modified in accordance with the length. Each axis is converted to a sub-resolution assist feature to yield the modified merged sub-resolution assist features.

Certain embodiments of the invention may provide one or more technical advantages. A technical advantage of one embodiment may be that merged SRAFs to be modified may be represented by their axes. Representing merged SRAFs by their axes may simplify modification of the SRAFs. Another technical advantage of one embodiment may be that the modification procedure may be readily selected according to the lengths and configuration of the SRAF axes.

Certain embodiments of the invention may include none, some, or all of the above technical advantages. One or more other technical advantages may be readily apparent to one skilled in the art from the figures, descriptions, and claims included herein.

BRIEF DESCRIPTION OF THE DRAWINGS

For a more complete understanding of the present invention and its features and advantages, reference is now made to the following description, taken in conjunction with the accompanying drawings, in which.

DETAILED DESCRIPTION OF THE DRAWINGS

Embodiments of the present invention and its advantages are best understood by referring to FIGS. 1 through 6 of the drawings, like numerals being used for like and corresponding parts of the various drawings.

Figure 1:
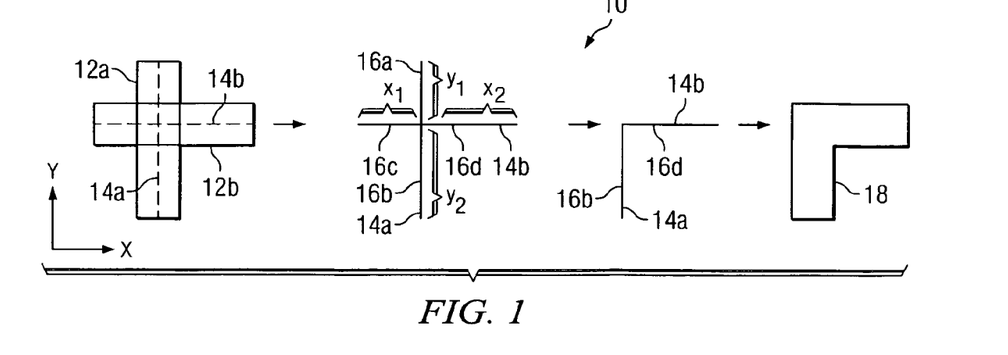
FIG. 1 is a diagram illustrating an example pattern for a mask that includes merged sub-resolution assist features (SRAFs) that may be modified according to one embodiment of the invention.

FIG. 1 is a diagram illustrating an example pattern 10 for a mask that includes merged sub-resolution assist features (SRAFs) that may be modified according to one embodiment of the invention. According to the embodiment, merged SRAFs to be modified may be represented by their axes. Representing merged SRAFs by their axes may simplify modification of the SRAFs. A modification procedure may be readily selected according to the lengths and configuration of the SRAF axes.

A mask may refer to a photomask used in a photolithographic system to define a pattern on an object such as a semiconductor wafer to form an integrated circuit. Typically, a mask is placed between a light source and the object. The mask selectively blocks, transmits, or otherwise modifies light from the light source to define a pattern on the object. A mask pattern may refer to a pattern of all or a portion of the mask that defines the pattern on the object.

A mask has a background on which features are defined. A dark field mask has an opaque background on which clear features are defined. A clear feature may refer to a feature that substantially transmits light through an otherwise opaque mask. A clear field mask has a clear background on which opaque features are defined. An opaque feature may refer to a feature that substantially blocks light from passing through an otherwise transparent mask.

Clear portions may comprise any suitable substantially transparent material operable to substantially transmit light. For example, clear portions may comprise glass, film, other suitable clear material, or any combination of the preceding. Opaque portions may comprise any suitable substantially opaque material operable to substantially block light. For example, opaque portions may comprise silver, chrome, chrome oxide, iron oxide, copper, aluminum, silicon oxide, other suitable opaque material, or any combination of the preceding.

According to the illustrated embodiment, a mask includes clear features such as main features and SRAFs. A main feature may refer to a feature of a mask that is designed to yield a printed main feature on a wafer, and may represent a clear feature such as a contact, a via, or other light field feature. The capability of a feature to yield a printed feature on a wafer may be referred to as printability. Accordingly, a main feature may refer to a feature that is designed to be printable.

An SRAF may refer to a feature of a mask that is designed to improve the process margin of a printed main feature on a wafer, but not to yield a printed feature on the wafer. That is, an SRAF may refer to a feature that is designed to be not printable. Process margin refers to the range of exposure dose and defocus over which acceptable image size tolerances can be maintained. According to one embodiment, an SRAF may comprise a grating that scatters light away from a printed main feature of the wafer. An SRAF, however, may comprise any suitable feature of a mask that is designed to be not printable. For example, an SRAF may comprise may comprise a rectangular glass aperture on a dark field chrome mask.

Diagram 10 illustrates merged SRAFs 12a-b. Merged SRAFs 12 typically yield a printed feature, so merged SRAFs 12 may be modified to avoid yielding a printed feature. A rectangular-shaped SRAF 12 has a longitudinal axis. According to the illustrated embodiment, SRAF 12a has a longitudinal axis 14a, and SRAF 12b has a longitudinal axis 14b.

Merged SRAFs 12 may be represented by their respective longitudinal axes 14. Representing merged SRAFs 12 by their respective longitudinal axes 14 may simplify modification of merged SRAFs 12. Axis 14a divides axis 14b into portions 16c-d of length $x_1$ and length $x_2$, respectively. Axis 14b divides axis 14a into portions 16a-b of length $y_1$ and length $y_2$, respectively. According to the illustrated embodiment, a portion 16 refers to a segment of an axis 14 from an end to an intersection. A portion 16, however, may refer to any part or all of an axis 14.

According to one embodiment, an axis 14 has a transverse width. The width may be selected to be sufficiently narrow to avoid interaction with other axes 14. The width may also be selected in accordance with a grid unit of a grid on which SRAFs 12 are placed. For example, the width may be selected such that the longitudinal axis of axis 14 lies on a grid line of the grid. Accordingly, the width may be selected such that it is an even multiple of a grid unit.

Axes 14 may be modified to modify merged SRAFs 12. The modification procedure applied to axes 14 may be determined in accordance to the shape of axes 14 and by the lengths of axes 14 and portions 16 of axes 14. Example procedures for modifying axes 14 are described in more detail with reference to FIGS. 4 through 7. According to the illustrated embodiment, portion 16a is removed from axis 14a, and portion 16c is removed from axis 14b. Axes 14 are converted to SRAFs 12 to form the resulting modified merged SRAFs 12.

Example pattern 10 is presented as an example only. Modifications, additions, or omissions may be made to pattern 10 without departing from the scope of the invention. Pattern 10 may include more, fewer, or other features. Additionally, features may arranged in any suitable manner without departing from the scope of the invention.

Figure 2:
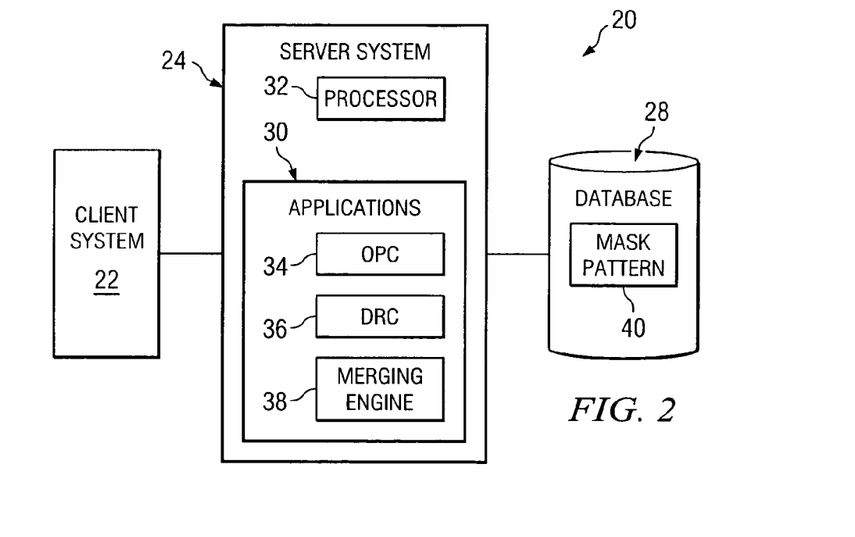
FIG. 2 is a block diagram illustrating one embodiment of a system operable to modify merged SRAFs.

FIG. 2 is a block diagram illustrating one embodiment of a system 20 operable to modify merged SRAFs 12. According to the embodiment, system 20 may modify merged SRAFs by first representing the SRAFs by their axes. Representing merged SRAFs by their axes may simplify modification of the SRAFs. System 20 may then select a modification procedure according to the lengths and configuration of the SRAF axes.

According to the illustrated embodiment, system 20 includes a client system 22, a server system 24, and a database 28 coupled as shown. According to one embodiment, client system 22 allows a user to communicate with server system 24 to execute applications that may be used to modify merged SRAFs 12. Client system 22 may include any hardware, software, other logic, or any combination of the preceding for communicating with server system 24, and may use any of a variety of computing structures, arrangements, and compilations to communicate with server system 24.

Server system 24 manages applications 30 that may be used to modify merged SRAFs 12. Server system 24 may include any hardware, software, other logic, or any combination of the preceding for managing applications 30, and may use any of a variety of computing structures, arrangements, and compilations to manage applications 30. According to the illustrated embodiment, server system 24 includes a processor 32 operable to execute one or more applications 30.

According to the illustrated embodiment, applications 30 include an optical proximity correction (OPC) module 34, a design rule checker (DRC) 36, and a merging engine 38. Optical proximity correction module 34 may adjust mask pattern 10 to compensate for deviations that may occur during the manufacturing process of an integrated circuit. Deviations may result from, for example, optical diffraction, etch effects, mask-making effects, resist effects, or other effects occurring during the manufacturing process. According to the illustrated embodiment, optical proximity correction module 34 may be used to estimate initial placement of SRAFs 12. The initial positions of SRAFs 12, however, may be estimated in any suitable manner.

Design rule checker 36 applies a set of design rules to a mask pattern and identifies features that violate the applied rules. A design rule may refer to a requirement for a mask pattern to yield a satisfactory mask that yields a satisfactory pattern on a wafer. The rule may pose a geometric requirement. As an example, a rule may define a minimum spacing value between two features. As another example, a rule may define a minimum width value for a feature. Example design rules may include mask rules, SRAF rules, process rules, other suitable rules, or any combination of the preceding.

According to one embodiment, design rule checker 36 may apply rules to a pattern 10 that includes main features in order to estimate initial positions of the SRAFs. According to the embodiment, a rule may state that if the pitch between two features is x, then a number n of SRAFs may be placed between the two features. For example, if 0<x<360 nanometers, then n=0; 361<x<570 nanometers, then n=1; and 571<x<720 nanometers, then n=2. The initial positions of SRAFs 12, however, may be estimated in any suitable manner.

Merging engine 38 modifies merged SRAFs 12. According to one embodiment, merging engine 38 may modify merged SRAFs by first representing the SRAFs by their axes. Representing merged SRAFs by their axes may simplify modification of the SRAFs. Merging engine 38 may then select a modification procedure according to the lengths and configuration of the SRAF axes. Merging engine 38 may use any suitable method to modify merged SRAFs 12. An example method is described in more detail with reference to FIG. 3.

Database 28 may include any hardware, software, other logic, or combination of the preceding for storing and facilitating retrieval of information used by server system 24. Also, database 28 may use any of a variety of data structures, arrangements, and compilations to store and facilitate retrieval of information used by server system 24.

According to the illustrated embodiment, database 28 stores a mask pattern 40. Mask pattern 40 may represent a pattern for a photolithographic mask for patterning a wafer to produce an integrated circuit. Mask pattern 40 may include main features and SRAFs. Mask pattern 40 may be generated from a design that indicates features to be patterned on a wafer. Mask pattern 40 may undergo optical proximity correction processing to compensate for distortions before or after or both before and after SRAFs 12 are merged.

Client system 22, server system 24, and database 28 may operate on one or more computers and may include appropriate input devices, output devices, storage media, processors, memory, or other components for receiving, processing, storing, and communicating information according to the operation of system 20. For example, the functions of client system 22, server system 24, database 28, or any combination of the preceding may be provided using a single computer system, for example, a personal computer. As used in this document, the term "computer" refers to any suitable device operable to execute instructions and manipulate data to perform operations, for example, a personal computer, work station, network computer, wireless telephone, personal digital assistant, one or more microprocessors within these or other devices, or any other suitable processing device.

Modifications, additions, or omissions may be made to system 20 without departing from the scope of the invention. For example, client system 22, server system 24, and database 28 may be integrated or separated according to particular needs. If any of client system 22, server system 24, and database 28 are separated, the separated components may be coupled to each other using a local area network (LAN), a metropolitan area network (MAN), a wide area network (WAN), a global computer network such as the Internet, or any other appropriate wire line, wireless, or other link.

Moreover, the operations of system 20 may be performed by more, fewer, or other modules. For example, the operations of design rule checker 36 and merging engine 38 may be performed by one module, or the operations of merging engine 38 may be performed by more than one module. Additionally, operations of system 10 may be performed using any suitable logic comprising software, hardware, other logic, or any suitable combination of the preceding. As used in this document, "each" refers to each member of a set or each member of a subset of a set.

Figure 3:
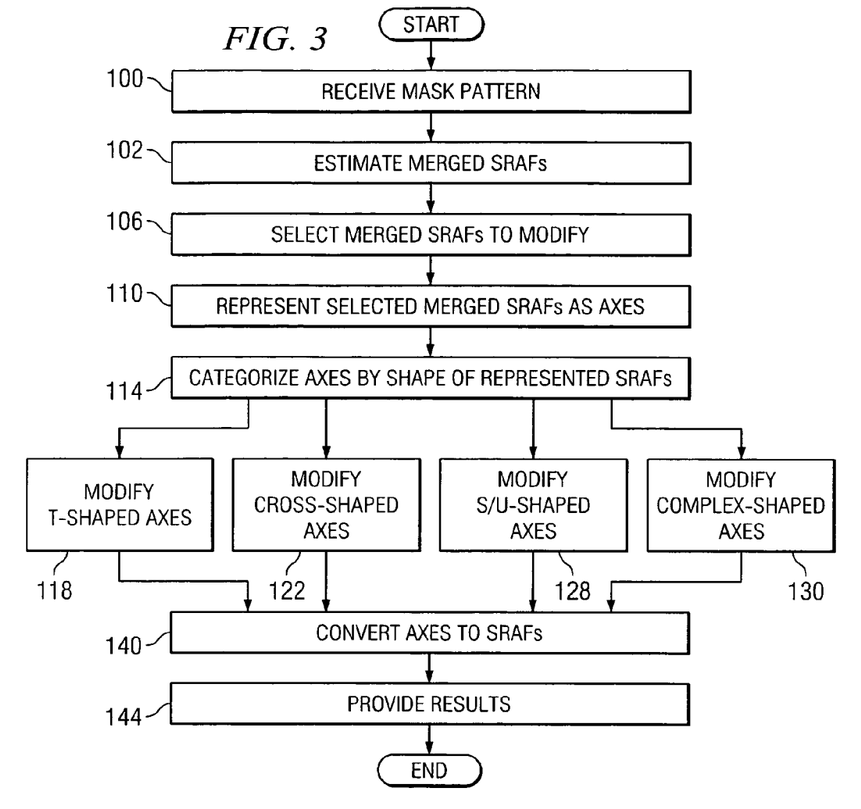
FIG. 3 is a flowchart illustrating one embodiment of a method for modifying merged SRAFs that may be used by the system of FIG. 2.

FIG. 3 is a flowchart illustrating one embodiment of a method for modifying merged SRAFs 12 that may be used by merging engine 38 of FIG. 2. The method begins at step 100, where system 10 receives mask pattern 40. Mask pattern 40 may include main features designed to pattern a wafer. Initial placement of SRAFs 12 is estimated at step 102. SRAFs 12 may be placed to improve the process margin of main features. According to one embodiment, design rule checker 32 may be used to estimate the initial positions of SRAFs 12.

Merged SRAFs 12 to be modified are selected at step 106. Merged SRAFs 12 that are shaped like a rectangle, square, or L typically do not yield printed features. Merged SRAFs 12 of other shapes, however, may yield printed features, and may be selected for modification. The selected merged SRAFs 12 are represented by their respective longitudinal axes 14 at step 110. Representing merged SRAFs 12 by their respective longitudinal axes 14 may simplify modification of merged SRAFs 12.

Axes 14 are categorized at step 114 to determine a modification procedure to modify merged SRAFs 12. Axes 14 may be categorized according to the shape of SRAFs 12 represented by axes 14. For example, axes 14 having a T, cross, S/U, or complex shape may represent SRAFs 12 having a T, cross, S/U, or complex shape, respectively. Axes 14, however, may have any suitable shape.

If axes 14 have a T shape, the method proceeds to step 118, where T-shaped axes 14 are modified. Modification of T-shaped axes 14 is described in more detail with respect to FIG. 4.

Figure 4:
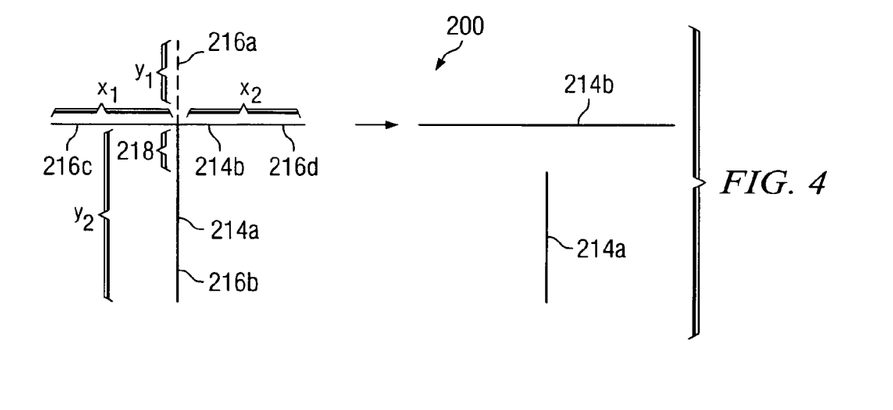
FIG. 4 is a diagram illustrating an example procedure for modifying axes representing T-shaped merged SRAFs.

FIG. 4 is a diagram 200 illustrating an example procedure for modifying axes representing T-shaped merged SRAFs. T-shaped merged SRAFs may be represented by axes 214a-b. A segmenting axis 214a intersects a segmented axis 214b, and is substantially perpendicular to segmented axis 214b. Segmenting axis 214a has a portion 216b, but does not have a portion 216a. Segmented axis 214b has portions 216c-d.

If a portion 216b is sufficiently long, axes 214a-b may be modified be removing a part 218 of portion 216b proximate to the intersection of axes 214a-b. Portion 216b may be regarded as sufficiently long if removing part 218 yields acceptable SRAFs, for example, SRAFs do not violate design rules. For example, portion 216b may be regarded as sufficiently long if the length $y_2$ of portion 216b is greater than or equal to the value SL given by Equation (1):

$$SL = SV_{min} + SRL_{min} + \tfrac{1}{2} SRW_{min} \tag{1}$$

where $SV_{min}$ represents a minimum spacing value, $SRL_{min}$ represents a minimum SRAF length, and $SRW_{min}$ represents a minimum SRAF width. A minimum spacing value may define the minimum allowed distance between features of a mask. A minimum SRAF length value may define the minimum allowed length for an SRAF. A minimum SRAF width define the minimum allowed width for an SRAF.

The length of removed part 218 may be selected such that removal of part 218 yields acceptable SRAFs. For example, part 218 may have a length PL given by Equation (2):

$$PL = SV_{min} + \tfrac{1}{2} SRW_{min} \tag{2}$$

Accordingly, removal of part 218 yields resulting SRAFs with a minimum distance between SRAFs greater than or equal to a minimum spacing value.

If portion 216a is not sufficiently long, a selected portion 216 may be shortened. A portion 216 may be shortened be removing a part of portion 216 opposite to the intersection of axes 214a-b. A shortest portion 216 may be selected to be shortened.

Modifications, additions, or omissions may be made to the procedure without departing from the scope of the invention. The procedure may include more, fewer, or other steps. Additionally, steps may be performed in any suitable order without departing from the scope of the invention.

Referring back to FIG. 3, if axes 14 have a cross shape, the method proceeds to step 122, where cross-shaped axes 14 are modified. Modification of cross-shaped axes 14 is described in more detail with respect to FIGS. 5A and 5B.

Figure 5A:
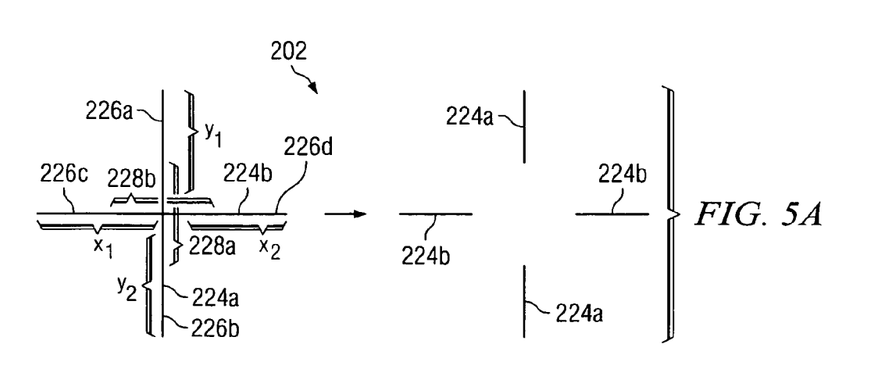
FIGS. 5A and 5B are diagrams illustrating example procedures for modifying axes representing cross-shaped merged SRAFs.
Figure 5B:
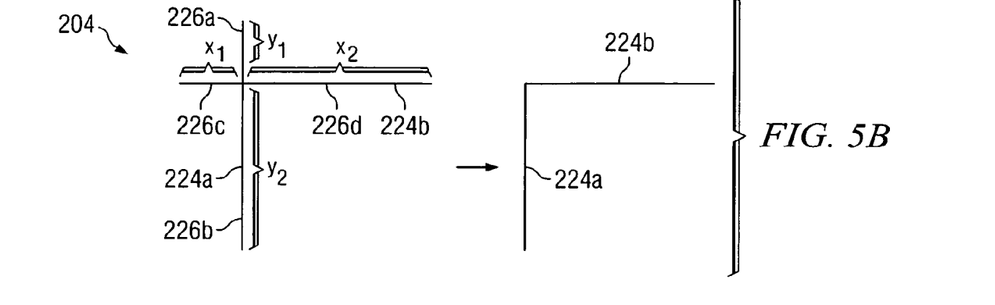

FIGS. 5A and 5B are diagrams 202 and 204 illustrating example procedures for modifying axes representing cross-shaped merged SRAFs. Cross-shaped merged SRAFs may be represented by axes 224a-b. Axis 224a intersects axis 224b, and is substantially perpendicular to axis 224b. Axis 224a has portions 226a-b, and axis 224b has portions 226c-d.

FIG. 5A is a diagram 202 illustrating an example procedure for modifying cross-shaped merged SRAFs. If portions 226a-d are sufficiently long, axes 224a-b may be modified be removing parts 228a-b of portions 226a-d proximate to the intersection of axes 224a-b. Portions 226a-d may be regarded as sufficiently long if removing parts 228a-b yields acceptable SRAFs. For example, portions 226 may be regarded as sufficiently long if the length of each portion 226 is greater than or equal to the value SL given by Equation (3):

$$SL = SV_{min} + SRL_{min} \tag{3}$$

The length of removed part 228 may be selected such that removal of part 228 yields acceptable SRAFs. For example, part 228 may have a length PL given by Equation (4):

$$PL = SV_{min} \quad (4)$$

FIG. 5B is a diagram 204 illustrating another example procedure for modifying cross-shaped merged SRAFs. If portions 226a-d are not sufficiently long, selected portions 226 may be removed. According to one embodiment, the shorter portion 226 of an axis 224 may be removed. For example, if $y_1$ is less than $y_2$, portion 226a is removed. Similarly, if $x_1$ is less than $x_2$, then portion 226c is removed. If the lengths of the portions 226 are equal, a portion 226 may be arbitrarily selected to be removed.

Other suitable criteria may be used to select the portion 226 to remove. As an example, a main feature proximate to the merged SRAFs may be used to determine the portion 226 to remove. As another example, a trial and error method may be used to determine which portion 226 to remove.

Modifications, additions, or omissions may be made to the procedure without departing from the scope of the invention. The procedure may include more, fewer, or other steps. Additionally, steps may be performed in any suitable order without departing from the scope of the invention.

Referring back to FIG. 3, if axes 14 have an S or U (S/U) shape, the method proceeds to step 118, where S/U-shaped axes 14 are modified. Modification of S/U-shaped axes 14 is described in more detail with respect to FIGS. 6A and 6B.

Figure 6A:
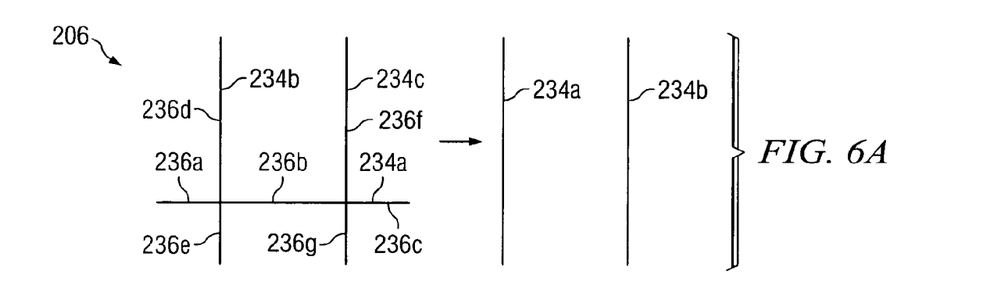
FIGS. 6A and 6B are diagrams illustrating example procedures for modifying axes representing multiple-intersection merged SRAFs.
Figure 6B:
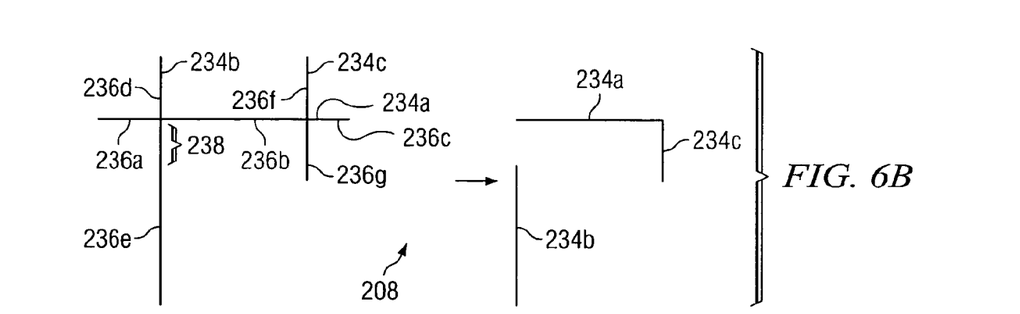

FIGS. 6A and 6B are diagrams 206 and 208 illustrating example procedures for modifying axes representing multiple-intersection merged SRAFs. Multiple-intersection merged SRAFs may comprise two-intersection merged SRAFs such as S/U-shaped merged SRAFs. S/U-shaped merged SRAFs may be represented by axes 234a-c. Coupling axis 234a intersects coupled axes 234b-c, and is substantially perpendicular to coupled axes 234b-c. Axis 234a has portions 236a-c, axis 234b has portions 236d-e, and axis 234c has portions 236f-g.

FIG. 6A is a diagram 206 illustrating an example procedure for modifying symmetric S/U-shaped merged SRAFs. Merged SRAFs may be symmetric if coupled axes 234b-c have approximately the same length. If merged SRAFs are symmetric, axes 234a-c may be modified be removing coupling axis 234a.

FIG. 6B is a diagram 208 illustrating an example procedure for modifying asymmetric S/U-shaped merged SRAFs. Merged SRAFs may be asymmetric if coupled axes 234b-c have substantially different lengths. For example, if the length of coupled axis 234b is approximately four times greater than that of coupled axis 234c.

Axes 234a-c may be modified by removing a part 238 of the longer of coupled axes 234b-c. If the longer portion 236e is sufficiently long, axes 234b-c may be modified be removing a part 238 of portion 236e proximate to the intersection of axes 234b-c. Portion 236e may be regarded as sufficiently long if removing part 238 yields acceptable SRAFs. For example, portion 236e may be regarded as sufficiently long if the length of portion 236e is greater than or equal to the value SL given by Equation (1).

Short portions 236a,d,c,f may be removed. A short portion 236 may refer to a portion having a sufficiently short length such that it has practically little or no effect on improving the process margin. A short portion may have a length less than 50 nanometers. For an example, a short portion 236 may have a length of less than 20 nanometers, for example, less than 10 nanometers.

If portion 236e is not sufficiently long, one or more selected portions 236 may be shortened. A portion 236 may be shortened be removing a part of portion opposite to the intersection of axes 234a-c. A shortest portion 236 may be selected to be shortened. Short portions 236 may also be removed.

Modifications, additions, or omissions may be made to the procedure without departing from the scope of the invention. The procedure may include more, fewer, or other steps. Additionally, steps may be performed in any suitable order without departing from the scope of the invention.

Referring back to FIG. 3, if axes 14 have a complex shape, the method proceeds to step 130, where complex-shaped axes 14 are modified. Modification of complex-shaped axes 14 is described in more detail with respect to FIG. 7.

Figure 7:
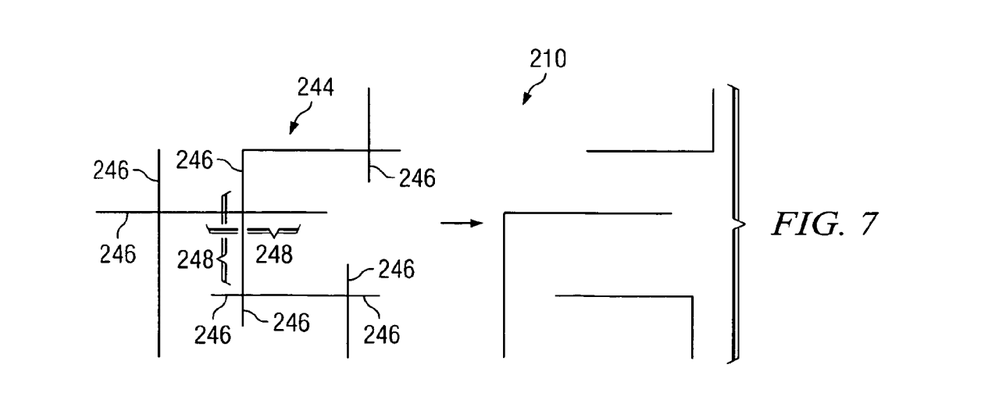
FIG. 7 is a diagram illustrating an example procedure for modifying axes representing complex-shaped merged SRAFs.

FIG. 7 is a diagram 210 illustrating an example procedure for modifying axes representing complex-shaped merged SRAFs. Complex-shaped merged SRAFs may be represented by axes 244. Axes 244 may be modified by performing the example procedures described with reference to FIGS. 4 through 6.

According to one embodiment, intersections of axes 244 with sufficiently long portions may be identified. Axes 244 may be modified by removing parts 248 of the sufficiently long portions. For example, intersecting axes 244 having a T shape may be modified in a manner substantially similar to that described with reference to FIG. 4. Intersecting axes 244 having a cross shape may be modified in a manner substantially similar to that described with reference to FIG. 5A. After parts 248 of the sufficiently long portions have been removed, short portions may be removed. For example, short portions may be removed in a manner substantially similar to that described with reference to FIG. 5B.

Modifications, additions, or omissions may be made to the procedure without departing from the scope of the invention. The procedure may include more, fewer, or other steps. Additionally, steps may be performed in any suitable order without departing from the scope of the invention.

Referring back to FIG. 3, the method proceeds to step 140 after axes 14 have been modified. Modified axes 14 are converted to SRAFs 12 at step 140. Axes 14 may be converted by replacing axes 14 with SRAFs 12 that satisfy SRAF rules. The results are provided at step 144. After providing the results, the method terminates.

Modifications, additions, or omissions may be made to the method without departing from the scope of the invention. The method may include more, fewer, or other steps. Additionally, steps may be performed in any suitable order without departing from the scope of the invention.

Certain embodiments of the invention may provide one or more technical advantages. A technical advantage of one embodiment may be that merged SRAFs to be modified may be represented by their axes. Representing merged SRAFs by their axes may simplify modification of the SRAFs. Another technical advantage of one embodiment may be that the modification procedure may be readily selected according to the lengths and configuration of the SRAF axes.

While this disclosure has been described in terms of certain embodiments and generally associated methods, alterations and permutations of the embodiments and methods will be apparent to those skilled in the art. Accordingly, the above description of example embodiments does not constrain this disclosure. Other changes, substitutions, and alterations are also possible without departing from the spirit and scope of this disclosure, as defined by the following claims.

What is claimed is:

1. A method for modifying a plurality of merged sub-resolution assist features, comprising:

receiving a mask pattern comprising a plurality of merged sub-resolution assist features forming a T shape, the plurality of merged sub-resolution assist features comprising a first segmenting sub-resolution assist feature intersecting a second segmenting sub-resolution assist feature at an intersection;

representing each sub-resolution assist feature by an axis of the each sub-resolution assist feature to yield a plurality of axes;

establishing that a segmenting axis of the plurality of axes is sufficiently long, the segmenting axis representing the first segmenting sub-resolution assist feature, wherein establishing that the segmenting axis of the plurality of axes is sufficiently long further comprises:

establishing that a length of the segmenting axis is greater than or approximately equal to a sum comprising:

a minimum spacing value;

a minimum sub-resolution assist feature length; and one-half of a minimum sub-resolution assist feature width;

removing a part of the segmenting axis, the part proximate to the intersection; and converting each axis to a sub-resolution assist feature to yield a plurality of modified merged sub-resolution assist features.

2. The method of claim 1, wherein removing the part of the segmenting axis further comprises:

removing a part of the segmenting axis having a length approximately equal to a sum comprising:

a minimum spacing value; and one-half of a minimum sub-resolution assist feature width.

3. A system for modifying a plurality of merged sub-resolution assist features, comprising:

means for receiving a mask pattern comprising a plurality of merged sub-resolution assist features forming a T shape, the plurality of merged sub-resolution assist features comprising a first segmenting sub-resolution assist feature intersecting a second segmenting sub-resolution assist feature at an intersection;

means for representing each sub-resolution assist feature by an axis of the each sub-resolution assist feature to yield a plurality of axes;

means for establishing that a segmenting axis of the plurality of axes is sufficiently long, the segmenting axis representing the first segmenting sub-resolution assist feature, wherein establishing that the segmenting axis of the plurality of axes is sufficiently long further comprises:

establishing that a length of the segmenting axis is greater than or approximately equal to a sum comprising:

a minimum spacing value;

a minimum sub-resolution assist feature length; and one-half of a minimum sub-resolution assist feature width;

means for removing a part of the segmenting axis, the part proximate to the intersection; and means for converting each axis to a sub-resolution assist feature to yield a plurality of modified merged sub-resolution assist features.

4. A method for modifying a plurality of merged sub-resolution assist features, comprising:

receiving a mask pattern comprising a plurality of merged sub-resolution assist features forming a T shape, the plurality of merged sub-resolution assist features comprising a first segmenting sub-resolution assist feature intersecting a second segmenting sub-resolution assist feature at an intersection;

representing each sub-resolution assist feature by an axis of the each sub-resolution assist feature to yield a plurality of axes;

establishing that a segmenting axis of the plurality of axes is sufficiently long, the segmenting axis representing the first segmenting sub-resolution assist feature, the segmenting axis of the plurality of axes established to be sufficiently long by:

establishing that a length of the segmenting axis is greater than or approximately equal to a sum comprising:

a minimum spacing value;

a minimum sub-resolution assist feature length; and one-half of a minimum sub-resolution assist feature width;

removing a part of the segmenting axis, the part proximate to the intersection, the part having a length approximately equal to a sum comprising:

a minimum spacing value; and one-half of a minimum sub-resolution assist feature width; and converting each axis to a sub-resolution assist feature to yield a plurality of modified merged sub-resolution assist features.

5. A method for modifying a plurality of merged sub-resolution assist features, comprising:

receiving a mask pattern comprising a plurality of merged sub-resolution assist features forming a cross shape, the plurality of merged sub-resolution assist features comprising a first sub-resolution assist feature intersecting a second sub-resolution assist feature at an intersection;

representing each sub-resolution assist feature by an axis of the each sub-resolution assist feature to yield a plurality of axes;

segmenting each axis to yield a plurality of portions;

establishing a length of each portion of the plurality of portions by establishing that each portion is sufficiently long by:

determining that a length of each portion is greater than or approximately equal to a sum comprising one-half of a minimum spacing value and a minimum sub-resolution assist feature length;

removing a part of an axis of the plurality of axes in accordance with the established lengths by removing a part of each axis, the part proximate to the intersection; and converting each axis to a sub-resolution assist feature to yield a plurality of modified merged sub-resolution assist features.

6. The method of claim 5, wherein removing the part of the axis of the plurality of axes in accordance with the established lengths further comprises:

identifying a shorter first portion of a first axis representing the first sub-resolution assist feature, the shorter first portion having a shorter length than a longer first portion of the first axis;

identifying a shorter second portion of a second axis representing the second sub-resolution assist feature, the shorter second portion having a shorter length than a longer second portion of the second axis; and removing the shorter first portion and the shorter second portion.

7. A method for modifying a plurality of merged sub-resolution assist features, comprising:

receiving a mask pattern comprising a plurality of merged sub-resolution assist features forming a cross shape, the plurality of merged sub-resolution assist features comprising a first sub-resolution assist feature intersecting a second sub-resolution assist feature at an intersection;

representing each sub-resolution assist feature by an axis of the each sub-resolution assist feature to yield a plurality of axes;

segmenting each axis to yield a plurality of portions;

establishing a length of each portion of the plurality of portions, the length established by establishing whether each portion is sufficiently long by determining that the length of each portion is greater than or approximately equal to a sum comprising:

one-half of a minimum spacing value; and a minimum sub-resolution assist feature length; and removing a part of an axis of the plurality of axes in accordance with the established lengths by performing the following:

if each portion is not sufficiently long:

identifying a shorter first portion of a first axis representing the first sub-resolution assist feature, the shorter first portion having a shorter length than a longer first portion of the first axis;

identifying a shorter second portion of a second axis representing the second sub-resolution assist feature, the shorter second portion having a shorter length than a longer second portion of the second axis; and removing the shorter first portion and the shorter second portion; and if each portion is sufficiently long:

removing a part of each axis, the part proximate to the intersection; and converting each axis to a sub-resolution assist feature to yield a plurality of modified merged sub-resolution assist features.

8. A method for modifying a plurality of merged sub-resolution assist features, comprising:

receiving a mask pattern comprising a plurality of merged sub-resolution assist features forming a multiple-intersection shape, the plurality of merged sub-resolution assist features comprising a coupling sub-resolution assist feature, the coupling sub-resolution assist feature intersecting a first coupled sub-resolution assist feature at a first intersection and a second coupled sub-resolution assist feature at a second intersection;

representing each sub-resolution assist feature by an axis of the each sub-resolution assist feature to yield a plurality of axes, a first coupled axis representing the first coupled sub-resolution assist feature, a second coupled axis representing the second coupled sub-resolution assist feature;

establishing a first length of the first coupled axis and a second length of the second coupled axis by establishing that the first length is substantially greater the second length;

removing a first part of a first axis of the plurality of axes in accordance with the established lengths by removing a part of the first coupled sub-resolution assist feature, the first part proximate to the first intersection;

removing a second part of a portion of a second axis of the plurality of axes if the portion is sufficiently long by establishing that a length of the segmenting axis is greater than or approximately equal to a sum comprising:

a minimum spacing value;

a minimum sub-resolution assist feature length; and one-half of a minimum sub-resolution assist feature width; and converting each axis to a sub-resolution assist feature to yield a plurality of modified merged sub-resolution assist features.

9. The method of claim 8, wherein:

establishing the first length of the first coupled axis and the second length of the second coupled axis further comprises:

establishing that the first length is substantially equivalent to the second length; and removing the first part of the first axis of the plurality of axes in accordance with the established lengths further comprises:

removing the coupling sub-resolution assist feature.

10. A method for modifying a plurality of merged sub-resolution assist features, comprising:

receiving a mask pattern comprising a plurality of merged sub-resolution assist features forming a multiple-intersection shape, the plurality of merged sub-resolution assist features comprising a coupling sub-resolution assist feature, the coupling sub-resolution assist feature intersecting a first coupled sub-resolution assist feature at a first intersection and a second coupled sub-resolution assist feature at a second intersection;

representing each sub-resolution assist feature by an axis of the each sub-resolution assist feature to yield a plurality of axes, a first coupled axis representing the first coupled sub-resolution assist feature, a second coupled axis representing the second coupled sub-resolution assist feature;

establishing a first length of the first coupled axis and a second length of the second coupled axis by establishing whether the first length is substantially equivalent to the second length;

removing a first part of a first axis of the plurality of axes in accordance with the established lengths by performing at least one of the following:

if the first length is substantially equivalent to the second length, removing the coupling sub-resolution assist feature; and if the first length is substantially greater the second length, removing a part of the first coupled sub-resolution assist feature, the part proximate to the first intersection removing a second part of a portion of a second axis of the plurality of axes if the portion is sufficiently long by establishing that a length of the segmenting axis is greater than or approximately equal to a sum comprising:

a minimum spacing value;

a minimum sub-resolution assist feature length; and one-half of a minimum sub-resolution assist feature width; and converting each axis to a sub-resolution assist feature to yield a plurality of modified merged sub-resolution assist features.

11. A method for modifying a plurality of merged sub-resolution assist features, comprising:

receiving a mask pattern comprising a plurality of merged sub-resolution assist features having a plurality of intersections;

representing each sub-resolution assist feature by an axis of the each sub-resolution assist feature to yield a plurality of axes;

segmenting each axis to yield a plurality of portions;

establishing a length of each portion of the plurality of portions;

repeating the following until the plurality of axes represent a plurality of non-printable sub-resolution assist features:

for each portion of the plurality of portions, removing a part of a portion if the portion is sufficiently long, the part proximate to an intersection, wherein removing a part of a portion if the portion is sufficiently long further comprises establishing that a length of the segmenting axis is greater than or approximately equal to a sum comprising:

a minimum spacing value;

a minimum sub-resolution assist feature length; and one-half of a minimum sub-resolution assist feature width; and for each portion of the plurality of portions, removing a portion if the portion is sufficiently short; and converting each axis to a sub-resolution assist feature to yield a plurality of modified merged sub-resolution assist features.

12. The method of claim 11, wherein removing a part of a portion if the portion is sufficiently long further comprises:

removing a part having a length approximately equal to a sum comprising:

a minimum spacing value; and one-half of a minimum sub-resolution assist feature width.

13. A method for modifying a plurality of merged sub-resolution assist features, comprising:

receiving a mask pattern comprising a plurality of merged sub-resolution assist features having a plurality of intersections;

representing each sub-resolution assist feature by an axis of the each sub-resolution assist feature to yield a plurality of axes;

segmenting each axis to yield a plurality of portions;

establishing a length of each portion of the plurality of portions;

repeating the following until the plurality of axes represent non-printable sub-resolution assist features:

for each portion of the plurality of portions, removing a part of a portion if the portion is sufficiently long, the part proximate to an intersection by:

establishing that a length of the segmenting axis is greater than or approximately equal to a sum comprising:

a minimum spacing value;

a minimum sub-resolution assist feature length; and one-half of a minimum sub-resolution assist feature width; and removing the part having a length approximately equal to a sum comprising:

a minimum spacing value; and one-half of a minimum sub-resolution assist feature width; and for each portion of the plurality of portions, removing a portion if the portion is sufficiently short; and converting each axis to a sub-resolution assist feature to yield a plurality of modified merged sub-resolution assist features.

* * * * *